United States Patent [19]

Hayden et al.

[11] Patent Number: 5,158,898
[45] Date of Patent: Oct. 27, 1992

[54] SELF-ALIGNED UNDER-GATED THIN FILM TRANSISTOR AND METHOD OF FORMATION

[75] Inventors: James D. Hayden; Bich-Yen Nguyen; Kent J. Cooper, all of Austin, Tex.

[73] Assignee: Motorola, Inc., Schaumburg, Ill.

[21] Appl. No.: 794,279

[22] Filed: Nov. 19, 1991

[51] Int. Cl.$^5$ .................. H01L 21/265; H01L 21/465
[52] U.S. Cl. ........................................ 437/21; 437/41; 437/228
[58] Field of Search ............... 437/21, 226, 41, 67, 437/52; 357/4, 23.7; 156/643; 365/104, 185

[56] References Cited

U.S. PATENT DOCUMENTS

| | | | |
|---|---|---|---|
| 4,614,021 | 9/1986 | Hulseweh | 156/643 |
| 4,654,121 | 3/1987 | Miller et al. | 357/23.7 |
| 4,656,731 | 4/1987 | Lam et al. | 357/23.7 |
| 4,803,176 | 2/1989 | Bower | 437/67 |
| 5,028,555 | 7/1991 | Haskell | 437/228 |
| 5,100,817 | 3/1992 | Cederbaum et al. | 437/41 |

Primary Examiner—Olik Chaudhuri
Assistant Examiner—Loc Q. Trinh
Attorney, Agent, or Firm—Robert L. King

[57] ABSTRACT

A self-aligned, under-gated TFT device (10). A base layer (14) is formed. A conductive layer (16) is formed overlying the base layer (14). A dielectric layer (18) is formed overlying the conductive layer (16). A sacrificial layer (20) is formed overlying the dielectric layer (18). The layers (16, 18, and 20) are etched to form a "pillar" region. A dielectric layer (22) and a planar layer (24), which both overlie the "pillar" region, are etched back to form a substantially planar surface and expose a top portion of the sacrificial layer (20). The sacrificial layer (20) is removed and a conductive layer (28) is formed overlying conductive region (16) and planar layer (22). Conductive layer (28) is used to form a self-aligned TFT device (10) via the formation of a source region (33) and a drain region (34) adjacent an aligned plug region (32).

15 Claims, 5 Drawing Sheets

SELF-ALIGNED UNDER-GATED THIN FILM TRANSISTOR AND METHOD OF FORMATION

FIELD OF THE INVENTION

The present invention relates generally to semiconductor processing, and more particularly, to thin film transistor formation.

BACKGROUND OF THE INVENTION

The integrated circuit industry has generally accepted the fact that thin film transistors (TFTs) are necessary for use in some applications. A portion of the integrated circuit industry that requires TFTs for future family generations is a market involving memory products such as fast static random access memories (FSRAMs). Research conducted on TFTs has lead to FSRAM circuits that have: (1) less array current leakage and less parasitic stand-by current; (2) less occurrences of leakage-current-induced soft errors; (3) improved resistance to soft errors and increased cell capacitance; and (4) a higher logic "on" voltage.

Although over-gated or top-gated thin film transistors have been researched and in some cases designed into FSRAM load transistor applications, under-gated or bottom-gated transistors are more popular due to FSRAM bit cell area packing concerns. An over-gated transistor is a transistor that has a source, a drain, and a channel region that are formed underlying a gate region. An under-gated transistor is a transistor that has a source, a drain, and a channel region that are formed overlying a gate region.

The use of a conventional under-gated TFT has several disadvantages: (1) the source and drain implants are not aligned to the TFT gate; therefore, the TFT is subjected to etch and photolithographic variation as well as substantial device performance alteration due to alignment-related variation; (2) drain offsets are lithographically defined and therefore consistent current leakage limiting is not achieved; and (3) many TFTs are performance limited by short channel behavior, such as an increase in charge carrier punch through as a TFT gate length is decreased.

SUMMARY OF THE INVENTION

The previously mentioned needs are fulfilled and other advantages achieved with the present invention. In one form, the present invention comprises a process for fabricating a semiconductor device wherein an insulated substrate is provided. The insulated substrate has a surface with a stacked structure. The stacked structure includes a gate electrode overlying the substrate surface, a dielectric layer overlying the gate electrode, and a sacrificial material layer overlying the dielectric layer. A substantially planar layer is formed on the substrate surface that exposes a portion of the sacrificial material layer. The sacrificial material layer is removed to expose the dielectric layer and form an opening in the substantially planar layer. The opening in the substantially planar layer having a sidewall. A conductive layer is formed overlying the dielectric layer, overlying the substantially planar layer, and lying adjacent to the sidewall. A planarizing layer is formed overlying the conductive layer. A portion of the planarizing layer is removed to form a substantially planar surface and expose portions of the conductive layer. The exposed portions of the conductive layer are doped to form source and drain current electrode regions. A portion of the conductive layer is selectively removed to form a semiconductor device.

The present invention will be understood by one skilled in the art from the detailed description below in conjunction with the accompanying drawings.

DESCRIPTION OF THE PREFERRED EMBODIMENT

Figure 1A:
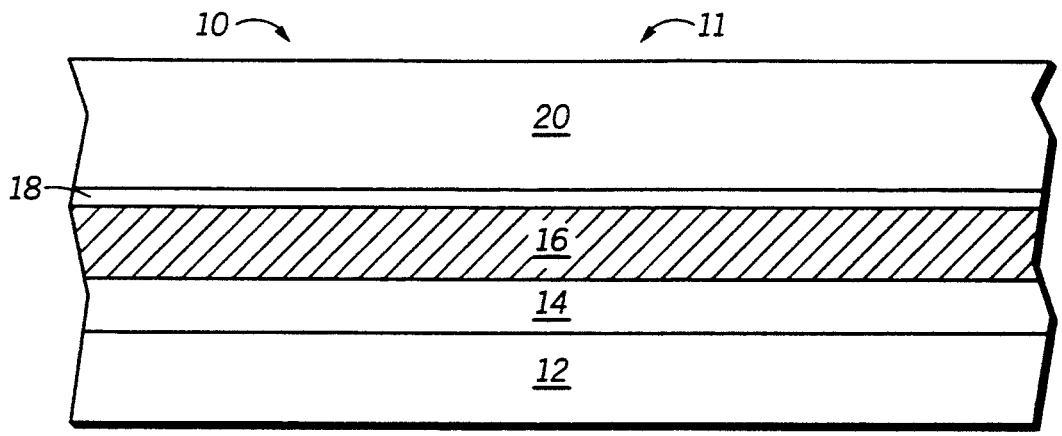
FIGS. 1A-1I illustrate, in cross-sectional form, a semiconductor device fabrication process for forming a self-aligned, under-gated thin film transistor in accordance with the present invention.

Illustrated in FIG. 1 is a semiconductor device fabrication process for forming a self-aligned, under-gated thin film transistor in accordance with the present invention. FIG. 1A illustrates two locations for under-gated thin film transistor (TFT) formations. The two TFTs are referred to as devices 10 and 11 throughout the process flow of FIG. 1. Two devices are presented to illustrate how devices can be positioned close to each other for memory applications. Using the process of FIG. 1, it is possible to form a single isolated TFT or simultaneously form any number of TFTs. Because of this, two devices 10 and 11, are depicted, but only one device may be explained and described in detail. It should be noted that if a process step or formation is mentioned and described for device 10, an analogous step or formation applies to device 11 as well. Also, regions and layers of device 10 and device 11 that serve similar functions are identically labeled. Devices 10 and 11 can have an underlaying layer 12, which is an optional layer. Underlying layer 12 can be an insulated substrate material, a substrate material, an underlying layer of conductive material such as polysilicon, epitaxial silicon and the like, a dielectric material such as silicon dioxide($SiO_2$), tetra-ethyl-ortho-silicate (TEOS), or boro-phosphate-silicate-glass (BPSG), or any like semiconductive layer of material. Underlying layer 12 is used to illustrate the use of TFT devices 10 and 11 as stacked, substrate-overlying silicon on insulator (SOI) devices or polysilicon on insulator devices. A base layer material, referred to as a base layer 14, is formed overlying the underlying layer 12. If the underlying layer 12 is not present then base layer 14 is most likely an insulated substrate material. The base layer 14, for most applications, is an isolation dielectric layer but can be a substrate or diffused region for some applications.

A first conductive layer 16 is deposited overlying the base layer 14. Conductive layer 16 is usually made of polysilicon and forms a gate electrode. A first dielectric layer 18 is deposited overlying the conductive layer 16. A sacrificial material layer, referred to as a layer of sacrificial material 20, is formed overlying the dielectric layer 18. The layer of sacrificial material 20 can be made of any material that can be etched selectively to dielectric layer 18. Because of the selective etch criterion and due to the fact that dielectric layer 18 is in most cases an oxide, the layer of sacrificial material 20 is usually polysilicon, nitride, or a like material.

Figure 1B:
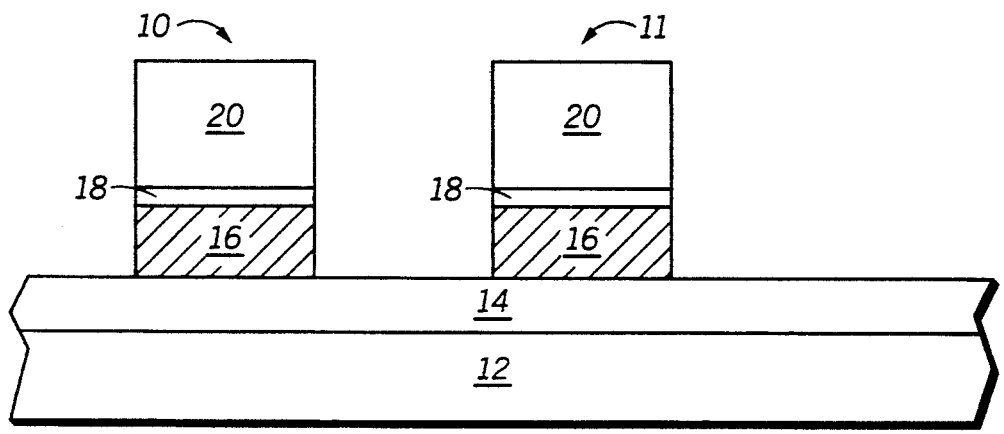

A gate-defining etch step is illustrated in FIG. 1B. For device 10, portions of the layer of sacrificial material 20, the dielectric layer 18, and the conductive layer 16 are etched away to form a "pillar-like" stacked structure. The "pillar-like" stacked structure is formed by a remaining region of the layer of sacrificial material 20, a remaining region of the dielectric layer 18, and a remaining region of the conductive layer 16. The remaining region of the layer of sacrificial material 20, the remaining region of the dielectric layer 18, and the remaining region of the conductive layer 16 are hereafter referred to respectively as conductive region 16, dielectric region 18 and sacrificial region 20. The conductive region 16 forms a gate or a control electrode for device 10.

Figure 1C:
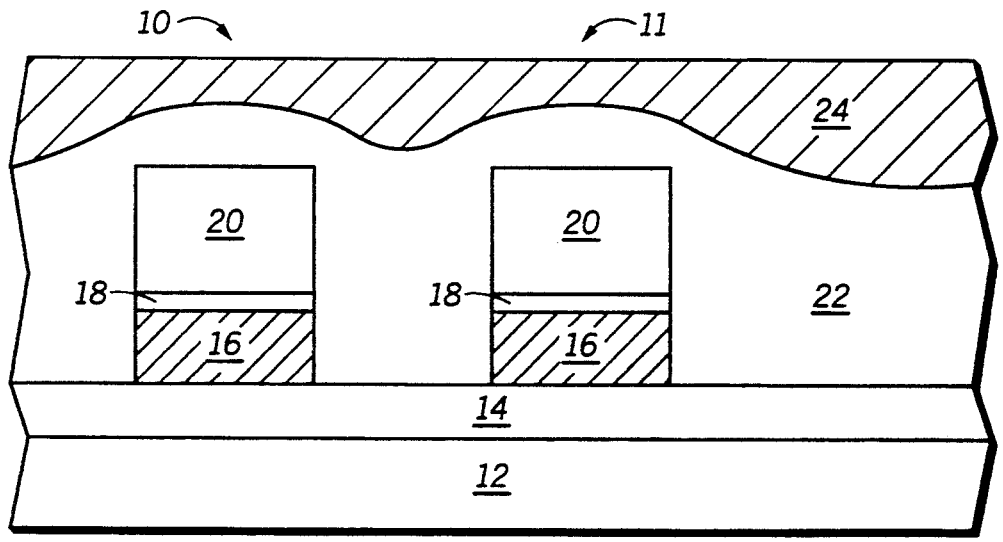

FIG. 1C illustrates a second dielectric layer 22 that is formed overlying the conductive region 16, the dielectric region 18, and the sacrificial region 20. Unless gate doping alteration, BPSG reflow, or other doped oxide properties are desired, the dielectric layer 22 is an undoped dielectric to ensure that the gate doping of the conductive region 16 is not altered. A planar layer of material, referred to as planar layer 24, is formed overlying the dielectric region 20. Planar layer 24 can be formed from photoresist, a spin on glass (SOG) material, an oxide deposition-reflow step, or the like. A substantially planar layer of material for planar layer 24 is beneficial for purposes of a uniform subsequent etch-back step.

Figure 1D:
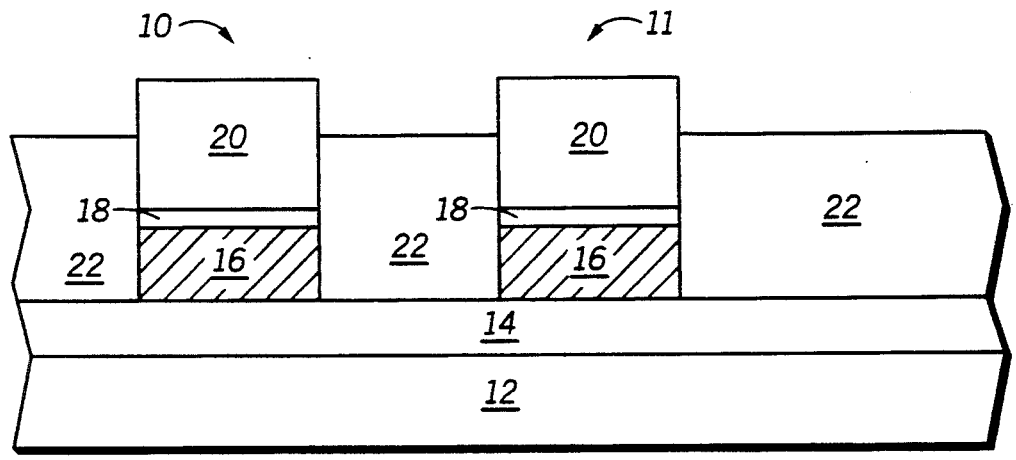

FIG. 1D illustrates the uniform subsequent etch-back step mentioned above. The planar layer 24 and the underlying dielectric layer 22 are plasma etched or removed in a chemical and/or mechanical manner. The chemical and/or mechanical etch/removal procedure must ensure that the planar layer 24 and the dielectric layer 22 are removed at a same relative etch or removal rate. The same relative etch rate will result in a remaining substantially planar layer or surface of the second dielectric, referred to as dielectric layer 22, and the entire removal of planar layer 24. This etch step exposes a top portion of the sacrificial region 20. If the etch rate mentioned above is not the same with respect to planar layer 24 and to dielectric layer 22, a substantially planar surface will be difficult to achieve.

The planarization and etch described in FIG. 1D can be performed in many ways. For example, an alternative way to forming the substantially planar dielectric layer 22 that exposes a top portion of the sacrificial region 20 is to deposit BPSG and run a reflow step at least once. Any method of planarizing an overlying surface, etching a planar overlying surface, and exposing sacrificial layer 20 will work. It is important to note that this chemical or mechanical etch-back process must expose a top portion of the sacrificial region 20 while not exposing other regions. The exposure of other regions could result in circuit failure due to electrical shorts, processing related device damage, or other complications.

Figure 1E:
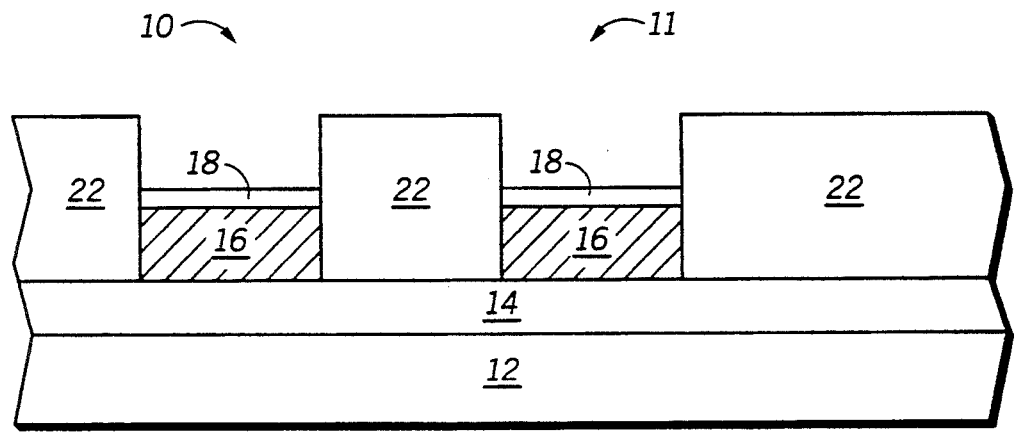
Figure 1F:
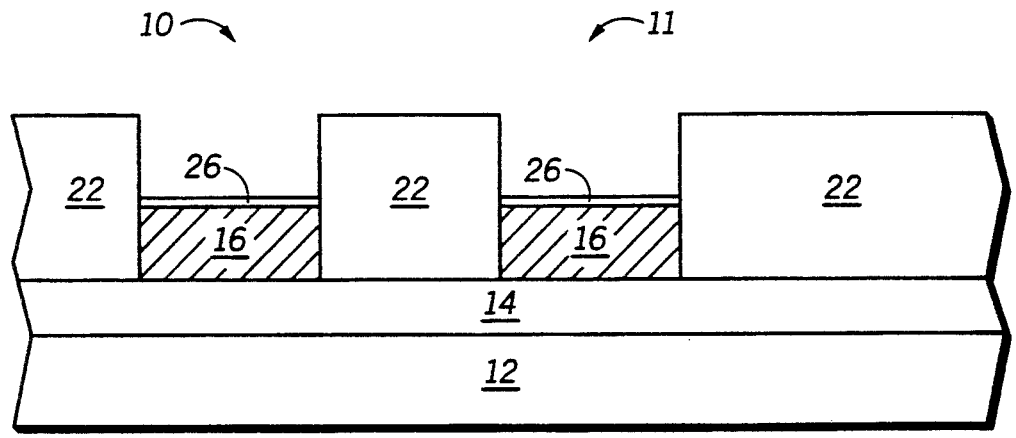

FIG. 1E illustrates a sacrificial region 20 removal step. The sacrificial region 20 is removed forming an opening in the substantially planar layer of material formed by the second dielectric layer 22. The opening in the dielectric layer 22 has a sidewall formed by a sidewall surface of the dielectric layer 22. At this point, the dielectric region 18 can function as a gate dielectric region for the device 10. An alternative to the dielectric region 18 functioning as a gate dielectric is illustrated in FIG. 1F. After the etch of the sacrificial region 20, the dielectric region 18 is also etched away. Following the dielectric layer 18 etch, a gate dielectric 26 is deposited or grown overlying the conductive region 16. The gate dielectric 26 is an oxide or oxide-nitride-oxide (ONO) and is usually very thin.

Figure 1G:
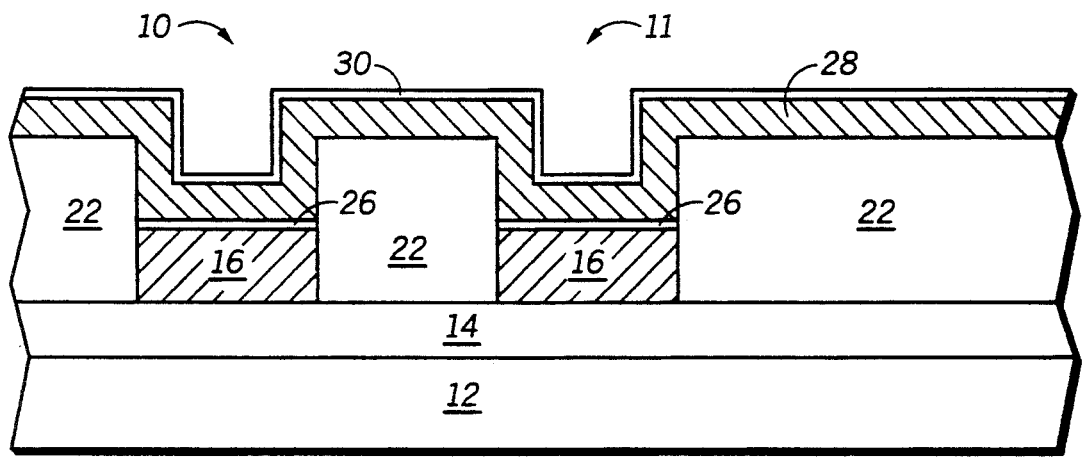

A second conductive layer 28 is deposited overlying the substantially planar surface of the dielectric layer 22 and the gate dielectric 26 as illustrated in FIG. 1G. A planarizing layer is formed overlying the conductive layer 28. The planarizing layer consists of at least one layer of material. The planarizing layer can be formed by a combination of dielectric layers, conductive layers, and like layers of material. In FIG. 1G, a dielectric layer 30 is deposited to form a bottom portion of the planarizing layer. The dielectric layer 30 is used as an etch stop for subsequent etch processing.

Figure 1H:
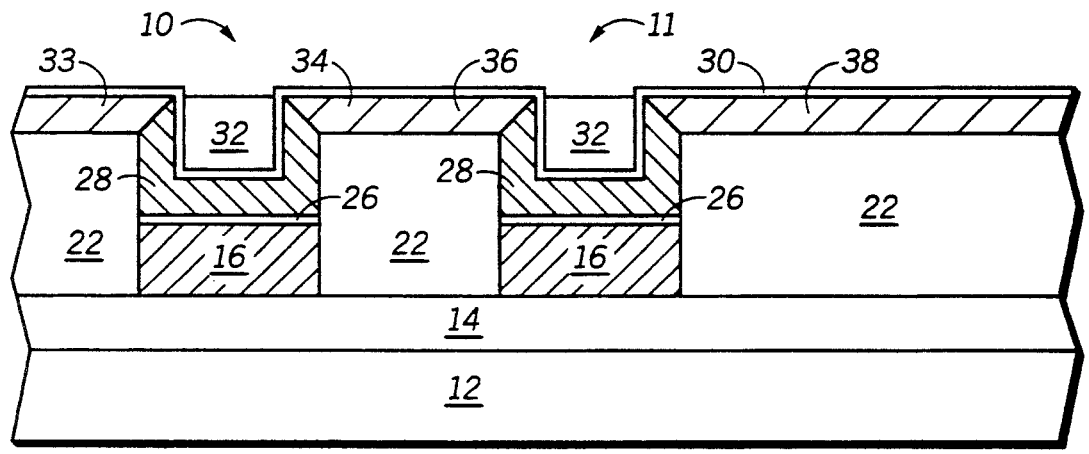

A top portion of the planarizing layer is formed by a layer 32. Layer 32 can be a polysilicon layer, TEOS, BPSG, nitride, an SOG layer, or a like layer. The planarizing layer is planarized via reflow, SOG, photoresist processing, etch technology, or the like. The planarizing layer is then etched back using selective etch technology and etch stops, such as dielectric layer 30, to form a substantially planar surface which includes an exposed portion or implantation accessible portion of the conductive layer 28 and a plug region 32 as illustrated in FIG. 1H. If the plug region 32, which is a portion of the planarizing layer, is made up of polysilicon and is isolated electrically from conductive region 28, then the device 10 can have several added advantages. Polysilicon is easy to work with mechanically, has very selective etch properties, and a polysilicon plug region 32 can be used to double-gate the device 10 to offer improved device 10 performance. It is important to note that several layers can be used to form the planarizing layer. A nitride deposition, followed by a TEOS film, followed by polysilicon deposition could produce a planarizing layer and form a substantially planar surface with a plug 32.

FIG. 1H also illustrates a diffusion, implant, knock-in, autodoping, or like step that forms a doped first current region or source region 33 of device 10 and a doped second current electrode or drain region 34 of device 10. In a simultaneous similar manner, a source region 36 and a drain region 38 is formed for device 11. These source and drain regions are formed self-aligned to the gate conductive region 16. An undoped region of conductive layer 28 is formed by the doping of source regions 33 and 36 and drain regions 34 and 38. The undoped region that lies directly above the gate conductive region 16 is a channel region of the device 10. Regions along the sidewall of the dielectric layer 22 between the dielectric layer 22 and the plug region 32 on both sides of the channel region are considered as offset regions 35 and 37 in FIG. 1I. Offset regions are used to help reduce TFT off-state leakage currents and in theory can improve upon or reduce known short channel effects.

Figure 1I:
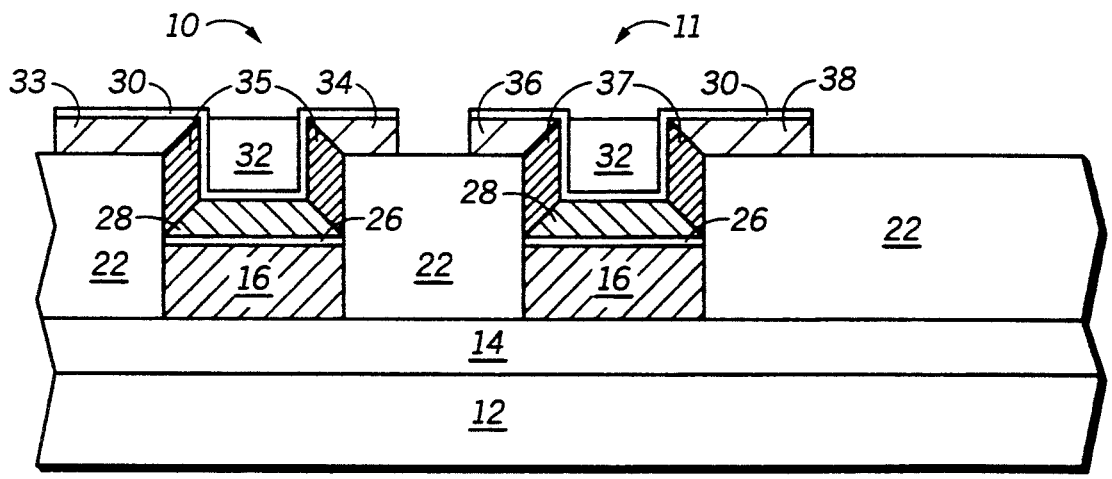

After formation of the doped and undoped regions described above, portions of the conductive layer 28, and other layer portions are selectively etched away to electrically isolate the source region 33, the drain region 34, and the channel region (not labeled but defined above) of device 10 from device 11, as illustrated in FIG. 1I.

Figure 2A:
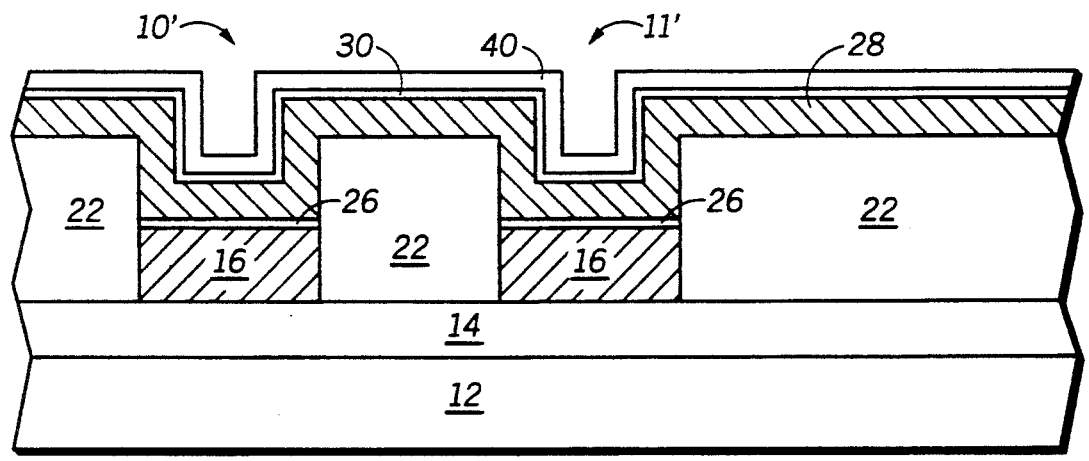
FIGS. 2A-2C illustrate, in cross-sectional form, alternative steps of a portion of the semiconductor device fabrication process of FIG. 1.
Figure 2B:
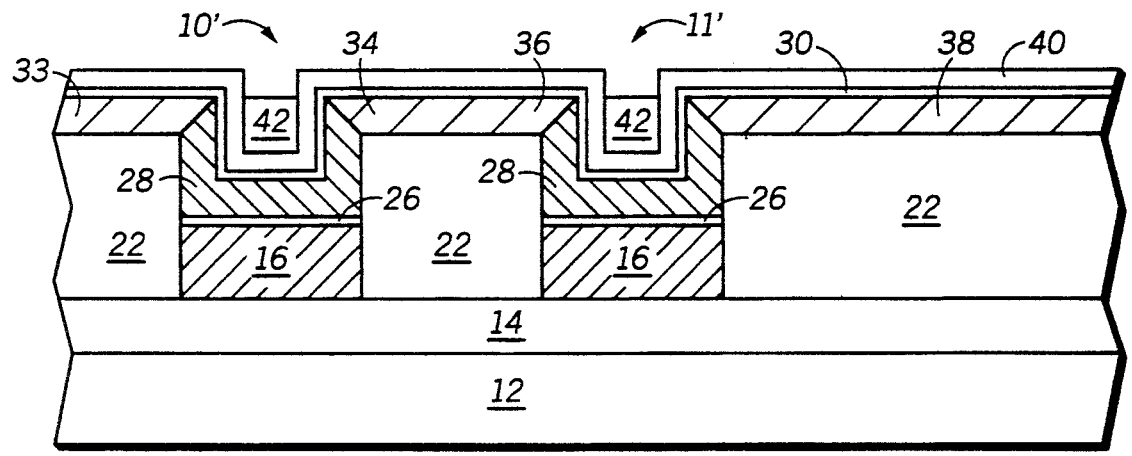
Figure 2C:
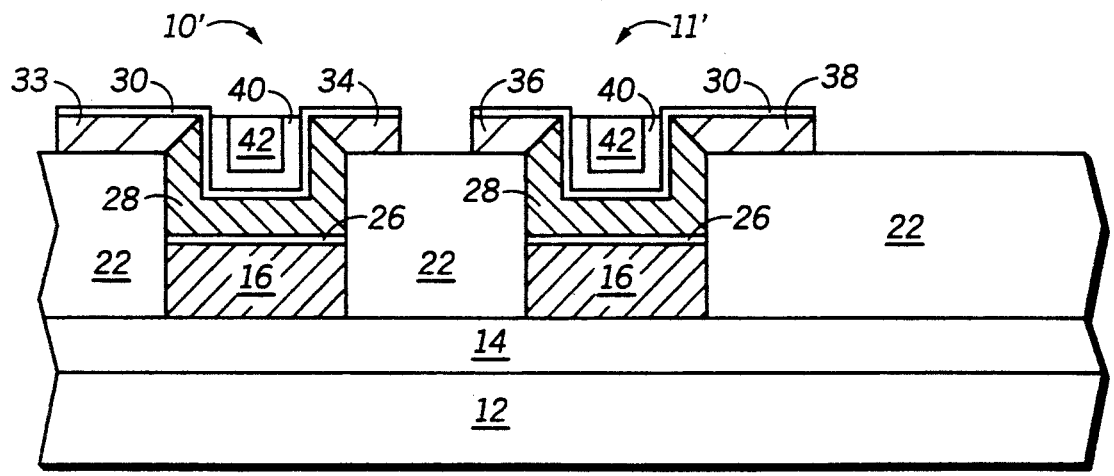

FIGS. 2A–2C illustrate a device 10' and a device 11'. Both device 10' and 11' illustrate, in more detail, the formation of a planarizing layer having multiple layers of material. Due to the fact that the process flow of FIGS. 2A-2C is similar to the process flow of FIGS. 1G-1I, the description of FIG. 2 will be brief, and some formations and layers will be identically or similarly labeled. In FIG. 2A a dielectric layer 30 is formed, which in most cases is nitride. A dielectric layer 40 is deposited overlying the dielectric layer 30. Dielectric layer 40 is a TEOS formed layer for example. In FIG. 2B, a final layer 42 is formed, and the same processing used to planarize the planarizing layer for FIG. 1 is used here to form a plug region 42. Plug region 42 is made up of polysilicon or BPSG in most cases. An implant is performed which forms source regions 33 and 36 and drain regions 34 and 38 in a manner similar to FIG. 1H. Isolation etching is performed as illustrated in FIG. 2C to isolate device 10 from device 11.

Figure 3:
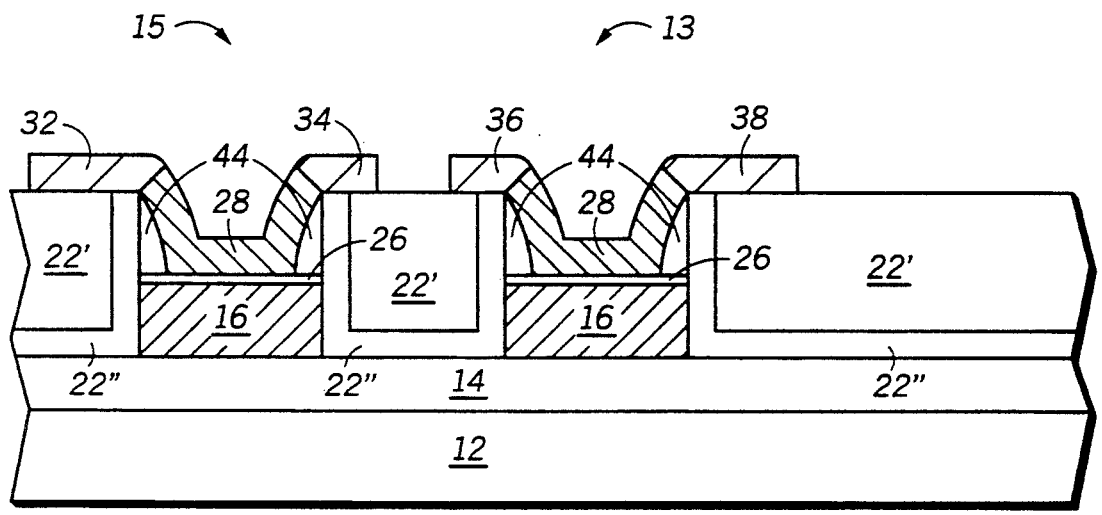
FIG. 3 illustrates, in cross-sectional form, another alternative embodiment in accordance with the present invention.

In FIG. 3 an alternative embodiment of FIG. 1I is presented to further illustrate two additional features. The first distinct feature is that a spacer 44 could be formed on the sidewall of the opening in the conductive layer 22, which in this example is made up of a doped region 22' and an undoped region 22". The opening in the conductive layer 22 was formed in FIG. 1E when the sacrificial region was removed. The formation of the spacer 44 allows the devices 13 and 15, which respectfully are similar to devices 11 and 10, to be more planar, to be easier to etch using conventional etch technology, to be more robust by reducing the known increase in electric fields at sharp edges that cause electrical breakdown and other known electric field related problems.

A second feature presented in FIG. 3 is the use of the doped region 22' and the undoped region 22" to form dielectric region 22. The doped region 22' can be made of boro-silicate-glass (BSG) and the undoped oxide 22" can be TEOS formed. The undoped oxide 22" can be a layer of material as illustrated in FIG. 3 or a spacer adjacent the conductive region 16. The function of the undoped oxide 22" is to protect the gate conductive region 16 from the dopant impurities of the doped region 22'. Once undoped region 22" is formed, the doped region 22' is formed and etched similar to the processing of FIGS. 1C-1D. The formation of the source regions 33 and 36 and the drain regions 34 and 38 can performed in a manner different to the preferred method of ion implantation, which was introduced for FIG. 1H and FIG. 2B. The difference is that instead of implanting, which is the desired method for many applications, the source regions 33 and 36 and the drain regions 34 and 38 can be created by heating devices 13 and 15 to thermally drive dopant impurities from the doped region 22' into adjacent portions of the conductive layer 28, therefore forming the source regions 33 and 36 and the drain regions 34 and 38 of FIG. 3.

In conclusion, devices 10 and 11, devices 10' and 11', and devices 13 and 15 are TFT devices that allow the following TFT circuit and design advantages: (1) Source and drain regions that are self-aligned to a gate region for improved circuit density, improved device performance, and reduced lithographic and etch alignment and resolution dependance; (2) improved short channel behavior, such as reducing charge carrier punch through; (3) consistent drain and source offsets to provide consistent current leakage limiting; and (4) a more controllable device series resistance. The inventive devices presented herein, while having the above added advantages, also have several conventional TFT advantages. The conventional TFT advantages are: (1) less array current leakage and less parasitic stand-by current; (2) less occurrences of leakage-current-induced soft errors; (3) increased cell capacitance; and (4) a higher logic "on" voltage.

While the present invention has been illustrated and described with reference to specific embodiments, further modifications and improvements will occur to those skilled in the art. For example, there are many ways in which a planarizing layer or a plug region can be formed. There are also many different layers of material that could be added or changed in the above descriptions and still serve the same basic function. Technology like multiple spacers, dual-gated concepts, and other known processing steps can be added to an under-gated self-aligned TFT without substantially altering the functionality or design of the inventive device presented herein. It is to be understood, therefore, that this invention is not limited to the particular forms illustrated and that it is intended in the appended claims to cover all modifications that do not depart from the spirit and scope of this invention.

We claim:

1. A process for fabricating a semiconductor device comprising the steps of:
   providing an insulated substrate having a surface with a stacked structure including a gate electrode overlying the substrate surface, a dielectric layer overlying the gate electrode, and a sacrificial material layer overlying the dielectric layer;
   forming a substantially planar layer on the substrate surface that exposes a portion of the sacrificial material layer;
   removing the sacrificial material layer to expose the dielectric layer and form an opening in the substantially planar layer, the opening having a sidewall;
   forming a conductive layer overlying the dielectric layer, overlying the substantially planar layer, and adjacent to the sidewall;
   forming a planarizing layer overlying the conductive layer;
   removing a portion of the planarizing layer to form a substantially planar surface and expose portions of the conductive layer;
   doping the exposed portions of the conductive layer to form source and drain current electrode regions; and
   selectively removing a portion of the conductive layer.

2. The process of claim 1 wherein the step of forming the substantially planar layer further comprises:
   forming a second dielectric layer overlying the sacrificial material layer, the first dielectric layer, the gate electrode, and the insulated substrate surface;
   forming a planar layer of material overlying the second dielectric layer of material; and
   removing the planar dielectric layer of material and portions of the second dielectric layer until a substantially planar layer is formed that exposes a top portion of the sacrificial material layer.

3. The process of claim 1 wherein the step of forming the substantially planar layer further comprises forming a second dielectric layer and using a heating process to reflow the second dielectric layer to form the substantially planar layer that exposes a top portion of the sacrificial material layer.

4. The process of claim 1 wherein the step of forming the planarizing layer further comprises forming the planarizing material from at least one dielectric material.

5. The process of claim 1 wherein the step of forming the planarizing layer further comprises:
forming a bottom portion of the planarizing layer from at least one dielectric material; and
forming a top portion of the planarizing layer from a conductive material.

6. The process of claim 1 wherein the step of removing the sacrificial material layer to form the opening having a sidewall further comprises forming at least one sidewall spacer on the sidewall.

7. The process of claim 1 wherein the steps of providing the insulated substrate having the surface with the stacked structure including the gate electrode and forming the conductive layer further comprise forming the gate electrode and the conductive layer both from polysilicon.

8. The process of claim 1 wherein the step of forming of the substantially planar layer further comprises:
forming a first undoped portion of the substantially planar layer by forming an undoped dielectric region adjacent to the gate electrode; and
forming a second doped portion of the substantially planar layer by forming a doped dielectric region overlying the first undoped portion of the substantially planar layer.

9. The process of claim 8 wherein the step of doping the exposed portions of the conductive layer further comprises heating the semiconductor device to diffuse dopant atoms from the second doped portion of the substantially planar layer into portions of the conductive layer that are adjacent to the second doped portion of the substantially planar layer forming the source current electrode region and the drain current electrode region.

10. A process for fabricating an under-gated thin film transistor comprising the steps of:
providing a base layer material;
depositing a first polysilicon layer overlying the base layer material;
depositing a first oxide layer overlying the first conductive layer;
depositing a layer of sacrificial polysilicon overlying the first oxide layer;
removing portions of the layer of sacrificial polysilicon, the first oxide layer, and the first polysilicon layer to form remaining regions of the layer of sacrificial polysilicon, the first oxide layer, and the first polysilicon layer, the remaining region of the first polysilicon layer forming a gate for the thin film transistor;
depositing a second oxide layer and planarizing the second oxide layer to form a substantially planar oxide layer that exposes a top portion of the remaining region of the layer of sacrificial polysilicon;
etching the remaining region of the layer of sacrificial polysilicon to form an opening in the substantially planar oxide layer, the opening having a second oxide layer sidewall;
defining a gate oxide region as a remaining portion of the first oxide layer;
depositing a second polysilicon layer overlying the gate oxide region and overlying the substantially planar oxide layer;
depositing a planarizing layer overlying the second polysilicon layer;
partially etching the planarizing layer to form a substantially planar surface which exposes portions of the second polysilicon layer; and
ion implanting the exposed portions of the second polysilicon layer to form a first current electrode and a second current electrode of the thin film transistor, the ion implanting resulting in an undoped channel region portion of the second polysilicon region.

11. The process of claim 10 wherein the step of depositing the second oxide layer and planarizing to form the substantially planar oxide layer further comprises:
forming a bottom portion of the second oxide layer from an oxide material, the bottom portion of the second oxide layer overlying each of the remaining region of the layer of sacrificial polysilicon, the remaining region of the first oxide layer, the remaining region of the first polysilicon layer, and the base layer of material;
forming a top portion of the second oxide layer from a planar spin on glass layer of material, the top portion overlying the bottom portion of the second oxide layer; and
removing the planar spin on glass layer of material and portions of the bottom portion of the second oxide layer until a substantially planar oxide layer is formed that exposes a top portion of the remaining region of the layer of sacrificial polysilicon.

12. The process of claim 10 wherein the step of depositing the second oxide layer to form the substantially planar layer further comprises forming the second oxide layer and using a predetermined reflow and etch step to form a substantially planar oxide layer from the second oxide layer.

13. The process of claim 10 wherein the steps of etching the remaining region of the layer of sacrificial polysilicon and defining the gate oxide region further respectively comprise removing the first oxide layer and forming a gate oxide layer overlying the remaining region of the first polysilicon layer to form the gate oxide region.

14. The process of claim 10 wherein the step of depositing the planarizing layer further comprises:
forming a bottom portion of the planarizing layer from at least one oxide material; and
forming a top portion of the planarizing layer from a polysilicon material.

15. The process of claim 10 wherein the step of etching the remaining region of the layer of sacrificial polysilicon to form the opening having the second oxide layer sidewall further comprises forming sidewall spacers on the second oxide layer sidewall.

* * * * *